(12) United States Patent
Mytkowicz et al.

(10) Patent No.: US 9,195,436 B2
(45) Date of Patent: Nov. 24, 2015

(54) PARALLEL DYNAMIC PROGRAMMING THROUGH RANK CONVERGENCE

(71) Applicant: Microsoft Corporation, Redmond, WA (US)

(72) Inventors: Todd D. Mytkowicz, Redmond, WA (US); Madanlal Musuvathi, Redmond, WA (US); Saeed Maleki, Champaign, IL (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/257,952

(22) Filed: Apr. 21, 2014

(65) Prior Publication Data

US 2015/0106783 A1 Apr. 16, 2015

Related U.S. Application Data

(60) Provisional application No. 61/890,824, filed on Oct. 14, 2013.

(51) Int. Cl.
| | |
|---|---|
| *G06F 9/45* | (2006.01) |
| *G06F 9/44* | (2006.01) |
| *G06F 17/11* | (2006.01) |
| *G06F 9/50* | (2006.01) |
| *G06Q 10/04* | (2012.01) |
| *H03M 13/41* | (2006.01) |

(52) U.S. Cl.
CPC *G06F 8/22* (2013.01); *G06F 8/456* (2013.01); *G06F 9/5066* (2013.01); *G06F 17/11* (2013.01); *G06Q 10/04* (2013.01); *H03M 13/41* (2013.01)

(58) Field of Classification Search
None
See application file for complete search history.

(56) References Cited

U.S. PATENT DOCUMENTS

| | | | | |
|---|---|---|---|---|
| 6,106,575 | A * | 8/2000 | Hardwick | 717/119 |
| 6,513,022 | B1 * | 1/2003 | Morgan | 706/16 |
| 7,503,039 | B2 * | 3/2009 | Inoue et al. | 717/154 |
| 7,603,546 | B2 * | 10/2009 | Narayanasamy et al. | 713/1 |
| 8,074,210 | B1 * | 12/2011 | Jones | 717/151 |
| 8,108,845 | B2 * | 1/2012 | Little et al. | 717/149 |
| 8,156,284 | B2 * | 4/2012 | Vorbach et al. | 711/118 |
| 8,521,758 | B2 * | 8/2013 | Nachnani et al. | 707/758 |
| 8,522,224 | B2 * | 8/2013 | Lee et al. | 717/149 |
| 8,549,499 | B1 * | 10/2013 | Ding et al. | 717/149 |
| 8,893,101 | B2 * | 11/2014 | Tripp | 717/155 |
| 2006/0253476 | A1 * | 11/2006 | Roth et al. | 707/100 |

(Continued)

OTHER PUBLICATIONS

Tang et al., "An Efficient Parallel Dynamic Programming Algorithm", 1195, pp. 65-73.*

(Continued)

*Primary Examiner* — Isaac T Tecklu
(74) *Attorney, Agent, or Firm* — Gregg R. Wisdom; Judy Yee; Micky Minhas

(57) ABSTRACT

The techniques and/or systems described herein implement parallel processing of a dynamic programming problem across stages and/or clusters by breaking dependencies between stages and/or clusters. For instance, the techniques and/or systems may identify dependencies between sub-problems of the dynamic programming problem and group the sub-problems into stages. The techniques and/or systems may also group the stages into clusters (e.g., at least two clusters to be parallel processed). Then, the techniques and/or systems generate one or more solutions to use instead of actual solutions so that the dynamic programming problem can be parallel processed across stages and/or clusters.

20 Claims, 6 Drawing Sheets

(56) References Cited

U.S. PATENT DOCUMENTS

| | | | |
|---|---|---|---|
| 2010/0077183 A1* | 3/2010 | Gonion et al. | 712/216 |
| 2010/0153654 A1* | 6/2010 | Vorbach et al. | 711/137 |
| 2012/0101929 A1* | 4/2012 | Howard | 705/35 |
| 2013/0066869 A1* | 3/2013 | Kusaka et al. | 707/737 |
| 2013/0262835 A1* | 10/2013 | Arakawa et al. | 712/220 |

OTHER PUBLICATIONS

"Welcome to NCBI", National Center for Biotechnology Information, retrieved on Feb. 12, 2014, at <<www.ncbi.nlm.nih.gov>>.

Allison et al., "A Bit-String Longest-Common-Subsequece Algorithm", Journal of Information Processing Letters, vol. 23, Issue 6, Dec. 1986, pp. 305-310.

Aluru et al., "Parallel biological sequence comparison using prefix computations", Journal of Parallel and Distributed Computing, vol. 63, Issue 3, Mar. 2003, pp. 264-272.

Antonio et al., "A Highly Parallel Algorithm for Multistage Optimization Problems and Shortest Path Problems", Journal of Parallel and Distributed Computing, vol. 12, No. 3. Jul. 1991, pp. 213-222.

Crochemore et al., "A fast and ractical bit-vector algorithm for the Longest Commoin Subsequence problem", Journal of Information Processing Letters, vol. 80, Issue 6, Feb. 2001, pp. 279-285.

Delgado et al., "Data Dependency Reduction in Dynamic Programming Matrix", 2011 Eighth nternational Joint Conference on Computer Science and Software Engineering (JCSSE), May 11, 2011, pp. 234-236.

"Deliver Flexible, Efficient, and Scalable Cluster Messaging", Intel MPI Library, retrieved on Feb. 12, 2014 at <<http://software.intel.com/en-us/intel-mpi-library/>>, Intel Developer Zone, Sep. 2012, 2 pages.

Develin et al., "On the Rank of a Tropical Matrix", In Proceedings of Discrete and Computational Geometry, Feb. 1, 2008, 21 pages.

Farrar, Michael "Striped Smith-Waterman speeds satabase searches six times over the SIMD implementations", Journal of Bioinformatics, vol. 23, No. 2, Jan. 2007, pp. 156-161.

Fettweis et al., "High-Speed Parallel Viterbi Decoding: Algorithm and VLSI-Architecture", IEEE Communications Magazine, vol. 29, Issue 5, May 1991, pp. 46-55.

Fettweis et al., "Parallel Viterbi Algorithm Implementation: Breaking the ACS-Bottleneck", IEEE Transactions on Communications, vol. 37, No. 8, Aug. 1989, pp. 785-790.

Galil et al., "Parallel Dynamic Programming", IEEE Transactions, vol. 5, No. 3, Mar. 1994, 18 pages.

Hillis et al., "Data Parallel Algorithms", In Communications of the ACM, vol. 29, No. 12, Dec. 1986, pp. 1170-1183.

Hirschberg, D.S. "A Linear Space Algorithm for Computing Maximal Common Subsequences", In Communications of the ACM, vol. 18, No. 6, Jun. 1975, pp. 341-343.

Hyyro, Heikki "Bit-Parallel LCS-length Computation Revisited", In Proceedings of 15th Australasian Workshop on Combinatorial Algorithms, Jul. 2004, 12 pages.

"Implementation of the Smith-Waterman Algorithm on a Reconfigurable Supercomputing Platform", In the White Paper of the Altera Corporation, Sep. 1007, 18 pages.

Ke et al., "Safe Parallel Programming using Dynamic Dependence Hints", In Proceedings of the 26th Annual ACM SIGPLAN Conference on Object-Oriented Programming, Systems, Languages, and Applications, Oct. 22, 2011, 16 pages.

Kumar et al., "Scalability of Parallel Algorithms for the All-Pairs Shortest Path Problem", Journal of Parallel and Distributed Computing, vol. 13, Issue3 2, Mar. 21, 1991, 26 pages.

Ladner et al., "Parallel Prefix Computation", Journal of the ACM, vol. 27, No. 4, Oct. 1980, pp. 831-888.

"Leadership Application Performance", Intel C and C++ Compilers, retrieved on Feb. 12, 2014 at <<http://software.intel.com/en-us/c-compilers>>, Intel Developer Zone, Feb. 2013, 2 pages.

Li et al., "160-fold acceleration of the Smith-Waterman algorithm using a field programmable gate array (FPGA)", BMC Bioinformatics, vol. 8, Jun. 7, 2007, 7 pages.

Ligowski et al., "An Efficient Implementation of Smith Waterman Algorithm on GPU Using CUDA, for Massively Parallel Scanning of Sequence Databases", In Proceedings of the 2009 IEEE International Symposium on Parallel & Distributed Processing, May 23, 2009, 8 pages.

Manavski et al., "CUDA compatible GPU cards as efficient hardware accelerators for Smith-Watherman sequence alignment", In the Proceedings of the 2007 Annual Meeting of the Italian Society of Bioinformatics (BITS), Mar. 26, 2008, 9 pages.

Martins et al., "A Multithreaded Parallel Implementation of a Dynamic Programming Algorithm for Sequence Comparison", Pacific Symposium on Biocomputing, Jan. 3, 2001, pp. 311-322.

Muraoka, Yoichi "Parallelism Exposure and Exploitation in Programs", In Doctoral Dissertation of Parallelism exposure and Exploitation in Programs, Feb. 1971, 270 pages.

Needleman et al., "A General Method Applicable to the Search for Similarities in the Amino Acid Sequence of Two Proteins", Journal of Molecular Biology, Mar. 1970, pp. 443-453.

Puschel et al., "SPIRAL: Code Generation for DSP Transforms", In Proceedings of the IEEE, vol. 93, No. 2, Feb. 2005, pp. 232-275.

Smith et al., "Identification of Common Molecular Subsequences", Journal of Molecurlar Biology, vol. 147, No. 1, Mar. 25, 1981, pp. 195-197.

Stivala et al., "Lock-free parallel dynamic programming", Journal of Parallel and Distributed Computing, vol. 70, No. 8, Aug. 2010, pp. 839-848.

Tan et al., "A Parallel Dunamic Programming Algorithn ona Multicore Achitecture", University of Delaware Department of Electrical and Computer Engineering Computer Architecture and Parallel Systems Laboratory, CAPSL Technical Memo 73, Feb. 14, 2007, 30 pages.

Tan et al., "Improving Performance of Dynamic Programming via Parallelism and Locality on Multicore Architectures", IEEE Transactions on Parallel and Distributed Systems, vol. 20, No. 2, Feb. 2009, pp. 261-274.

Tang et al., "EasyPDP: An Efficient Parallel Dynamic Programming Runtime System for Comutational Biology", Journal of Latex Class Files, vol. 6, No. 1. Jan. 2010, 19 pages.

Viterbi, Andrew, "Error Bounds for Convolutional Code and a Asymptotically Optimum Decoding Algorithm", IEEE Transactions on Infromation Theory, vol. 13, No. 2, Apr. 1967, pp. 260-269.

Maleki et al., "Parallelizing Dynamic Programming Through Rank Convergence", in the Proceedings of the 19th ACM SIGPLAN symposium on Principles and Practice of Parallel Programming, Feb. 2014, 14 pages.

International Search Report & Written Opinion for PCT Patent Application No. PCT/UUS2014/060218, mailed on Jan. 26, 2015, filed on Oct. 13, 2014, 13 pages.

Prabhu et al., "Safe Programmable Speculative Parallelism", in the Proceedings of the 2010 ACM SIGPLAN conference on Programming Language Design and Implementation, Jun. 2010, 12 pages.

International Search Report & Written Opinion for PCT Application No. PCT/US2014/060218, mailed Sep. 11, 2015, filed on Oct. 13, 2014, 9 pages.

\* cited by examiner

PARALLEL DYNAMIC PROGRAMMING THROUGH RANK CONVERGENCE

RELATED APPLICATIONS

This application claims the benefit of U.S. Provisional Application No. 61/890,824, filed Oct. 14, 2013, the entire contents of which are incorporated herein by reference.

BACKGROUND

Dynamic programming algorithms are used to solve a variety of problems in real-world applications. For example, dynamic programming algorithms may be used in text string matching, genomics, gene sequencing, image processing, signal processing, speech recognition, economics and finance. A dynamic programming problem may comprise multiple sub-problems and an optimal solution to the dynamic programming problem may be constructed from optimal solutions to the individual sub-problems. Conventionally, parallel processing of a dynamic programming problem is limited by dependencies between sub-problems. For instance, a device cannot parallel process two sub-problems if a subsequent sub-problem depends on a solution computed in a previous sub-problem. Rather, computing a solution to the subsequent sub-problem is delayed until the solution to the previous sub-problem is computed and passed to the subsequent sub-problem.

SUMMARY

The techniques and/or systems described herein implement parallel processing of a dynamic programming problem across stages and/or clusters by breaking dependencies between stages and/or clusters. For instance, the techniques and/or systems may identify dependencies between sub-problems of the dynamic programming problem and group the sub-problems into stages. The techniques and/or systems may also determine groups of stages to be processed in parallel (e.g., a group of stages may also be referred to as a cluster). Then, the techniques and/or systems generate one or more solutions to use instead of actual solutions so that the dynamic programming problem can be parallel processed across stages and/or clusters.

BRIEF DESCRIPTION OF THE DRAWINGS

The detailed description is presented with reference to accompanying figures. In the figures, the left-most digit(s) of a reference number identifies the figure in which the reference number first appears. The use of the same reference numbers in different figures indicates similar or identical items.

DETAILED DESCRIPTION

Figure 1:
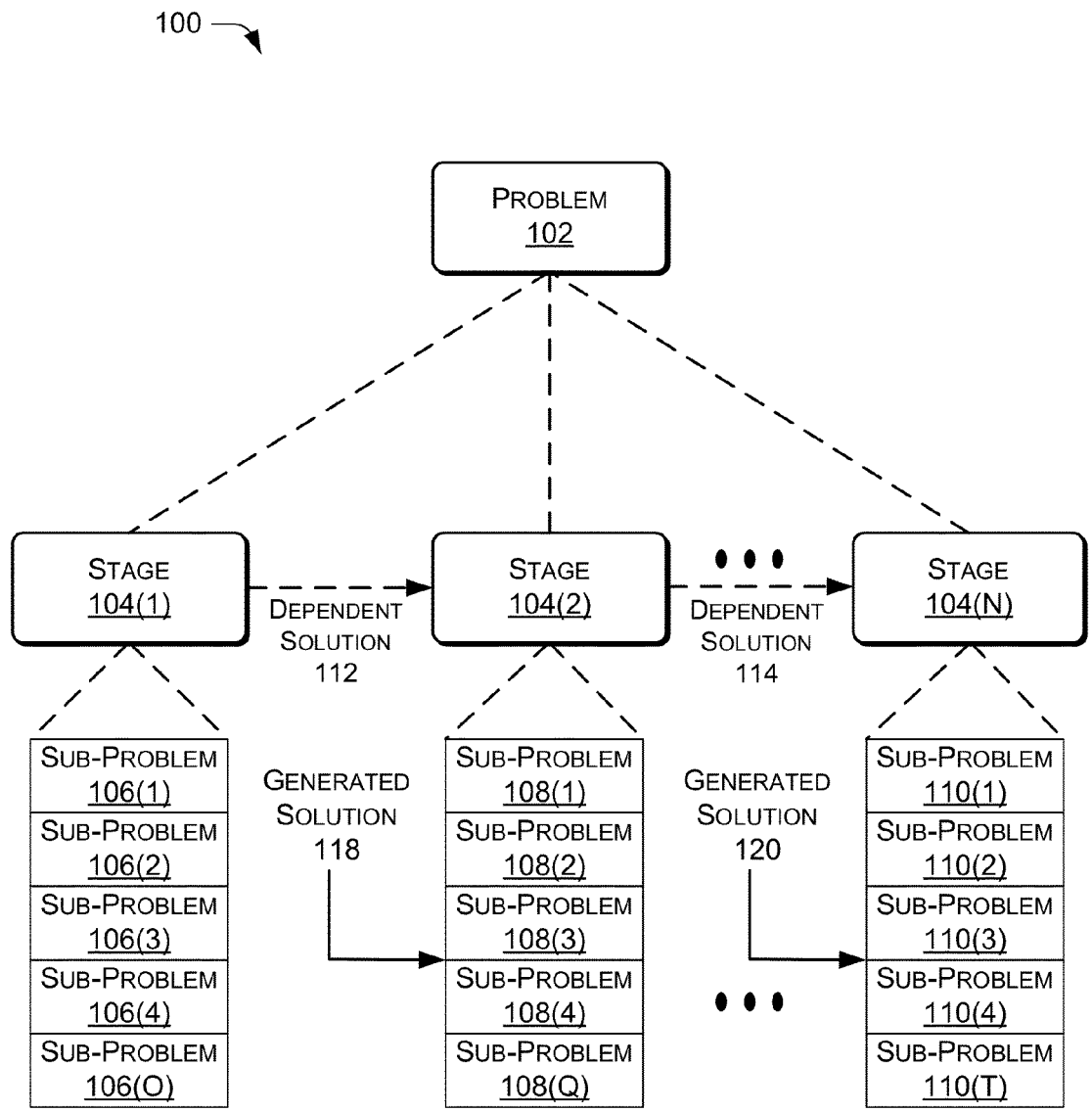
FIG. 1 illustrates an example diagram of a dynamic programming problem with sub-problems that comprise multiple stages, in accordance with various embodiments.

The techniques and/or systems described herein implement parallel processing of a dynamic programming problem across stages. In response to receiving or identifying a dynamic programming problem for processing (e.g., to be solved), the techniques and/or systems determine multiple stages of the dynamic programming problem. Each stage comprises one or more sub-problems and each stage is separated by at least one dependency, as further discussed herein. For instance, processing of a subsequent stage may depend on at least one solution (e.g., a value) computed or calculated during processing of a previous stage. Therefore, a dependency between two stages, as discussed herein, may be an actual computed solution that is provided from one stage (e.g. the previous stage) to a next stage (e.g., the subsequent stage) so the sub-problems in the next stage can use the actual computed solution to compute or calculate another solution. For example, the actual computed solution from the previous stage may be a value that the sub-problems in the subsequent stage use in an equation to compute the other solution.

The techniques and/or systems discussed herein are capable of implementing parallel dynamic programming across stages by generating solution(s) (e.g., an arbitrarily generated solution such as a randomly generated value) and initiating parallel processing of a stage (e.g., the subsequent stage) by using the generated solution instead of the actual computed solution produced in the previous stage. Put another way, the techniques and/or systems use the generated solution in lieu of a yet to be computed actual solution so that processing of the subsequent stage can be initiated without having to wait for the previous stage to compute the actual computed solution and without having to wait for the previous stage to pass the actual computed solution to the subsequent stage. Therefore, the techniques and/or systems are able to eliminate or break dependencies between stages and implement parallel processing of the dynamic programming problem across stages by using generated solutions instead of actual computed solutions.

In various embodiments, processing subsequent stages using a generated solution instead of the actual computed solution may not initially produce correct or exact subsequent stage solutions (e.g., for the sub-problems in the subsequent stage). However, by virtue of rank convergence, solutions computed in the subsequent stages using the generated solution eventually are correct and exact and are therefore parallel to solutions that would have been computed if the actual computed solution from the previous stage had been used rather than the generated solution (e.g., if the dependency had not been broken).

Conventional approaches to dynamic programming are able to parallel process sub-problems within an individual stage (e.g., a single stage) because computations of a sub-problem within the individual stage do not depend on the computations or output solution of another sub-problem within the same individual stage. For instance, conventional approaches may employ a multi-core processor to parallel process sub-problems within an individual stage because the multi-core processor comprises two or more independent central processing units (e.g., the cores) capable of reading and executing instructions simultaneously (e.g., one core executes a first sub-problem within the stage, another core executes a second sub-problem within the stage, and so forth).

However, a subsequent stage cannot be parallel processed with the current or previous stage because the subsequent stage is dependent upon an actual computed solution of the current or previous stage. Therefore, conventional approaches are limited to parallel processing within a single stage (e.g., simultaneously computing solutions to sub-problems grouped together in a single stage).

The techniques and/or systems described herein implement parallel processing across multiple stages where at least one subsequent stage depends on one or more actual computed solutions from a previous stage. Implementing parallel processing across multiple stages reduces an amount of time it takes a device to process a dynamic programming problem, thereby improving device performance and efficiency. In various embodiments, parallel processing across multiple stages may be implemented in addition to parallel processing within an individual stage.

The techniques and/or systems described herein may improve the efficiency of dynamic programming algorithms such as, for example, the Viterbi algorithm, the Longest Common Subsequence (LCS) algorithm, the Needleman-Wunsch algorithm, and the Smith-Waterman algorithm. The Viterbi algorithm is a dynamic programming algorithm that finds a most likely path (e.g., referred to as the Viterbi path) that results in a sequence of observed events, particularly in the context of Markov information sources and hidden Markov models. The Viterbi algorithm may be used as a decoding algorithm for convolutional codes used in code division multiple access (CDMA) and global system for mobile (GSM) communications, dial-up modems, satellite communications, and wireless local area networks (LANs). The Viterbi algorithm may also be used in speech recognition, speech synthesis, keyword spotting, computational linguistics, and bioinformatics. The LCS algorithm finds the longest common subsequence between two input strings (e.g., differentiates between two bodies of text). The Needleman-Wunsch algorithm is used in bioinformatics to align protein or nucleotide sequences. The Smith-Waterman algorithm performs local sequence alignment, e.g., for determining similar regions between two strings or nucleotide or protein sequences. These example dynamic programming problems and/or algorithms and other dynamic programming problems and/or algorithms may be used in association with the techniques and/or systems described herein.

FIG. 1 illustrates an example diagram 100 of a dynamic programming problem 102 with multiple stages 104(1) . . . 104(N). The dynamic programming problem 1-2 may be divided, or separated, into the multiple stages 104(1) . . . 104(N). Although three stages are shown in FIG. 1 for purposes of discussion, N represents a number that is greater than or equal to two. As discussed above, each stage 104(1) . . . 104(N) includes one or more sub-problems that can be computed in parallel at least because the execution (e.g., processing) of one sub-problem within an individual stage does not depend on a solution or computed output (e.g., a value) of another sub-problem within the same individual stage. Put another way, a stage may be defined as one or more sub-problems that can be executed independent of one another. Thus, stage 104(1) includes sub-problems 106(1) . . . 106(0) (e.g., where O represents a number that is greater than or equal to one). Stage 104(2) includes sub-problems 108(1) . . . 108(Q) (e.g., where Q represents a number that is greater than or equal to one). Stage 104(N) includes sub-problems 110(1) . . . 110(T) (e.g., where T represents a number that is greater than or equal to one). In various embodiments, the number of sub-problems within the individual stages 104(1) . . . 104(N) may be different (e.g., the numbers represented by two or more of O, Q, and T are different numbers). In other embodiments, the number of sub-problems within the individual stages 104(1) . . . 104(N) may be the same (e.g., the numbers represented by two or more of O, Q, and T are the same numbers).

As shown, two adjacent stages are separated by at least one dependent solution (e.g., also referred to herein as a dependency). The dependent solution that separates two stages may be a solution to an individual sub-problem or the dependent solution may be based on two or more solutions from two or more sub-problems, respectively. For example, stage 104(1) may be a first stage in a sequence of stages and may not depend on solution computed in a previous stage since stage 104(1) is the first stage in the sequence. The processing and/or execution of the sub-problems in 106(1) . . . 106(0) in stage 104(1) may produce the dependent solution 112 (e.g., one or more computed values) that is passed to stage 104(2) (e.g., the next stage in the sequence) so that one or more of the sub-problems 108(1) . . . 108(Q) in stage 104(2) can be executed. Similarly, the processing and/or execution of the sub-problems in 108(1) . . . 108(Q) in stage 104(2) produce the dependent solution 114 that is passed to stage 104(N) (e.g., the next stage in the sequence) so that one or more of the sub-problems 110(1) . . . 110(T) in stage 104(N) can be executed. As discussed above, a consequence of the dependent solution 112 is that stage 104(2) of the dynamic programming problem 102 conventionally cannot be processed until stage 104(1) is completely processed and the dependent solution 112 is computed and provided to stage 104(2). Further, a consequence of the dependent solution 114 is that stage 104(N) of the dynamic programming problem 102 conventionally cannot be processed until stage 104(2) is completely processed and the dependent solution 114 is computed and provided to stage 104(N).

The techniques and/or systems described herein eliminate and break the dependencies so that stages can be processed in parallel. For instance, the techniques and/or systems generate solutions (e.g., arbitrary solutions) which are used to process a subsequent stage instead of actual computed solutions from a previous stage (e.g., dependent solution 112 and/or dependent solution 114). As shown in FIG. 1, a generated solution 118 is generated and may be used in lieu of dependent solution 112 so that the sub-problems 108(1) . . . 108(Q) of stage 104(2) can be processed in parallel with the sub-problems 106(1) . . . 106(O) of stage 104(1). Moreover, a generated solution 120 is generated and may be used in lieu of dependent solution 114 so that the sub-problems 110(1) . . . 110(T) of stage 104(N) can be processed in parallel with the sub-problems 108(1) . . . 108(Q) of stage 104(2). Accordingly, by generating and using the generated solutions, the techniques and/or systems described herein break dependencies so that a subsequent stage does not have to wait for an actual computed solution from a previous stage to be provided, and parallel processing across stages can thus be realized.

Figure 2:
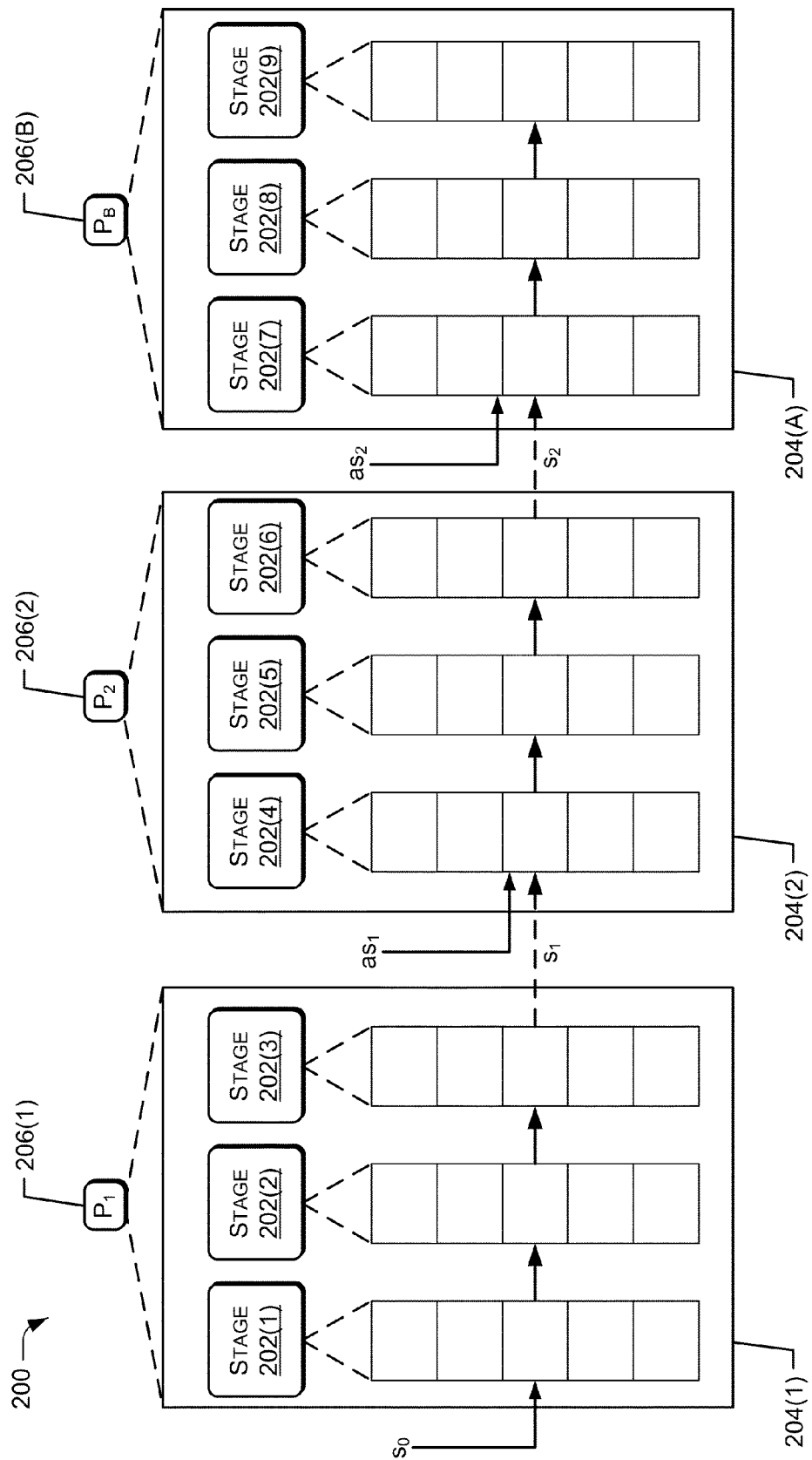
FIG. 2 illustrates an example diagram of a dynamic programming problem with groups of stages that can be processed in parallel, in accordance with various embodiments.

FIG. 2 illustrates an example diagram 200 of a dynamic programming problem where multiple stages 202(1) . . . 202(9) are divided or separated into groups of stages 204(1) . . . 204(A) (e.g., clusters) for parallel processing by one or more processing units 206(1) . . . 206(B), respectively. In various embodiments, a cluster comprises more than one stage (e.g., at least two stages). In various embodiments, a device implementing parallel processing of a dynamic programming problem may group stages into a number of clusters so that properties of rank convergence can achieve correct or almost correct solutions (e.g., solutions computed using a generated solution become parallel to solutions that would have been generated using actual solutions). In some implementations, the number of clusters corresponds to a number of processing units executing on the device (e.g., A and B in FIG. 2 are the same number).

In a first example, a device may have a number of multi-core processors (e.g., three as shown in FIG. 2), and thus, each processing unit $206(1) \ldots 206(B)$ may correspond to one of the three multi-core processors of the example device. As discussed above, an individual multi-core processor may parallel process sub-problems within a single stage, and therefore, the multiple multi-core processors (e.g., processing units $206(1) \ldots 206(B)$ in this first example) in combination may parallel process the dynamic programming problem across stages. In a second example, each of the processing units $206(1) \ldots 206(B)$ may be an individual core within a single multi-core processor, and thus, the single multi-core processor may parallel process the dynamic programming problem across stages. However, in this second example, parallel processing of sub-problems within a single stage may not be possible since multiple cores to implement parallel processing within the stage may be unavailable (e.g., rather a single core processes a cluster).

FIG. 2 illustrates an example sequential implementation of a dynamic programming problem split across three processing units $206(1) \ldots 206(B)$. Processing unit $206(1)$ initiates processing of stage $202(1)$ using an initial solution $s_0$ (e.g., a known value or actual solution) and computes the sub-problems in stage $202(1)$, stage $202(2)$ and stage $202(3)$. In various embodiments, processing unit $206(1)$ may not compute the sub-problems in stage $202(2)$ until the sub-problems in stage $202(1)$ are computed and an actual computed solution (e.g., a dependent value) is passed from stage $202(1)$ to stage $202(2)$. Similarly, processing unit $206(1)$ may not compute the sub-problems in stage $202(3)$ until the sub-problems in stage $202(2)$ are computed and an actual computed solution is passed from stage $202(2)$ to stage $202(3)$. Thus, the device and specifically, the processing unit $206(1)$, may implement sequential stage execution within an individual cluster.

As discussed above, initiation of processing of stage $202(4)$ conventionally has to wait for the actual solution, $s_1$, to be computed. The actual solution, $s_1$, may be a solution of the final stage $202(3)$ of the cluster $204(1)$. Similarly, the initiation of processing of stage $202(7)$ conventionally has to wait for the actual solution, $s_2$, to be computed. The actual solution, $s_2$, is the solution of the final stage $202(6)$ of the cluster $204(2)$.

To implement parallel processing across stages, FIG. 2 eliminates or breaks the dependencies upon $s_1$ and $s_2$. To eliminate or break the dependencies, processing unit $206(2)$ uses a generated solution $as_1$ and the processing unit $206(2)$ begins executing the sub-problems in stage $202(4)$ using the generated solution $as_1$ rather than waiting for the actual solution, $s_1$, to be computed and passed (e.g., processing unit $206(2)$ implements sequential stage execution within an individual cluster). Similarly, processing unit $206(B)$ uses a generated solution $as_2$ and the processing unit $206(B)$ begins executing the sub-problems in stage $202(7)$ using the generated solution $as_2$ rather than waiting for the actual solution, $s_2$, to be computed and passed (e.g., processing unit $206(B)$ implements sequential stage execution within an individual cluster).

In FIG. 2, the solutions for the early stages computed by processing unit $206(2)$ and processing unit $206(B)$ using the generated solutions may be incorrect solutions that are not close to the actual solutions that would have been computed had the dependent solutions (e.g., $s_1$ and $s_2$) been used. For example, the solution(s) to stage $202(4)$ of cluster $204(2)$ and the solutions to stage $202(7)$ of cluster $204(A)$ may likely be incorrect solutions. However, as a number of stages within an individual cluster increases and as a result of rank convergence (e.g., to a rank-"1" matrix), the solutions in subsequent stages within an individual cluster (e.g., stage $202(6)$ and stage $202(9)$) will eventually be solutions that are close to, or the exact same as, the actual solutions that would have been computed using the dependent solutions (e.g., $s_1$ and $s_2$). Put another way, because of rank convergence, the error between (i) solutions computed using the generated solutions and (ii) solutions that would have been computed using actual solutions (e.g., the dependent solutions), is minimized as the number of stages within a cluster increases. Thus, solutions calculated or computed based on generated solutions become parallel to solutions that would have been computed if actual solutions had been used instead of the generated solutions.

Thus, in some implementations, a device implementing parallel processing of a dynamic programming problem may break dependencies between individual stages. In some implementations, the device implementing parallel processing of a dynamic programming problem may break dependencies between groups of stages. Put another way, the device may determine a subset of a larger set of dependencies to break (e.g., $s_1$ and $s_2$ in FIG. 2). Moreover, the grouping of stages into clusters may be arbitrary (e.g., a size of a cluster or a number of clusters). For example, a device may evenly divide stages into clusters based on number or processing units. In another example, the creation of groups of stages may be based on a rate of rank-convergence. In particular, the overhead (e.g., a number of stages) per cluster/processor may be proportional to a number of fix-ups required, which in turn may be proportional to the rate of rank-convergence. If the rank converges to one (e.g., "1") within ten steps, each processor may need to process at least ten steps.

While FIG. 2 illustrates three clusters $204(1) \ldots 204(A)$ with three corresponding processing units $206(1) \ldots 206(B)$, it is understood, that a dynamic programming problem may include any number of stages that may be divided into any number of clusters (e.g., two, three, four, five, ten, fifteen and so forth). Moreover, a number of stages within an individual cluster may vary from one cluster to the next (e.g., a first cluster may include eight stages, a second cluster may include four stages, a third cluster may include twelve stages, etc.)

In some implementations, each sub-problem (e.g., represented by the boxes beneath the stages $202(1) \ldots 202(9)$ of FIG. 2) corresponds to computing a value in a table (e.g., a stage may be a column in the table or a stage may be a row in the table). Therefore, the processing units $206(1) \ldots 206(B)$ may be tasked with executing a dynamic programming problem to populate or fill-up an empty table with calculated or computed values. Moreover, one or more of the values in a stage may be the actual solution, or may be used to compute the actual solution, which is to be passed or provided to a subsequent stage of the dynamic programming problem.

The techniques and/or systems described above with respect to FIG. 1 and/or FIG. 2 may be used on, for example, (i) Viterbi Decoding which may be used to communicate over noisy channels, or (ii) LCS which may be used as the basis for a popular tool that finds a largest sub-sequence between two input strings (e.g., text input strings).

Figure 3:
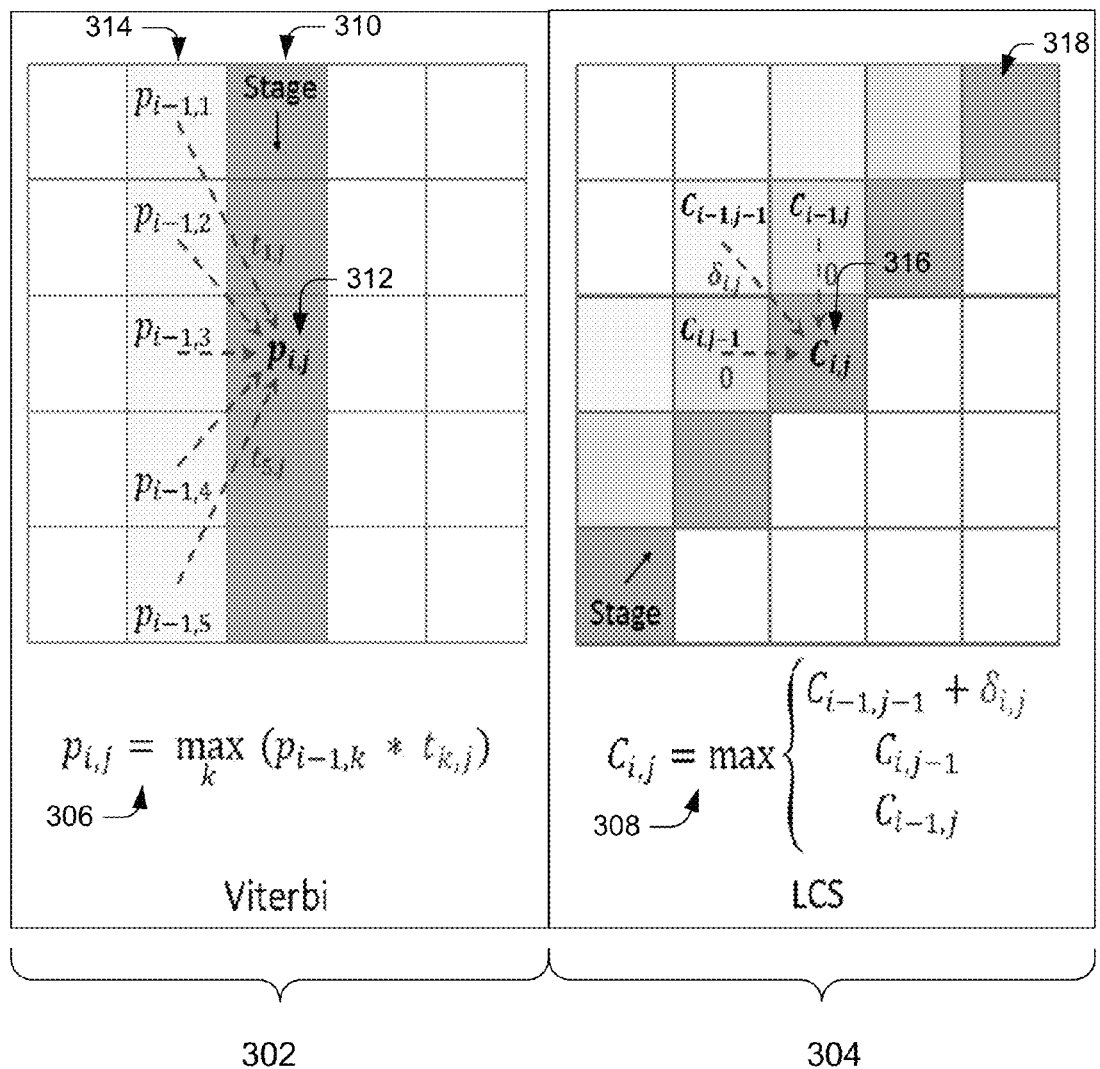
FIG. 3 illustrates stages of example dynamic programming algorithms, in accordance with various embodiments.

FIG. 3 illustrates stages of a Viterbi table 302 and stages of a LCS table 304. A box, or cell, in the tables correspond to a sub-problem whose solution is given by a recurrence equation. For instance, the recurrence equation pointed to by 306 is an example recurrence equation for Viterbi and the recurrence equation pointed to by 308 is an example recurrence equation for LCS. The recurrence equations shown in FIG. 3 group sub-problems into stages separated by a dependency.

Consequently, in various embodiments, the recurrence equation may be used to identify dependencies and divide the sub-problems into stages.

A solution of a sub-problem within a stage does not depend upon a solution of another sub-problem within the same stage. Therefore, in the Viterbi table 302, a stage is a column (e.g., the shaded column pointed to by 310) because a cell (e.g., cell pointed to by 312) depends upon solutions from cells in a previous column (e.g., the column pointed to by element 314) but not solutions from cells of the same column (e.g., the shaded column pointed to by element 310). In the LCS table 304, a cell (e.g., cell pointed to by 316) depends upon solutions from three neighboring cells and thus, a stage in LCS is along an anti-diagonal (e.g., the shaded anti-diagonal pointed to by 318).

Figure 4:
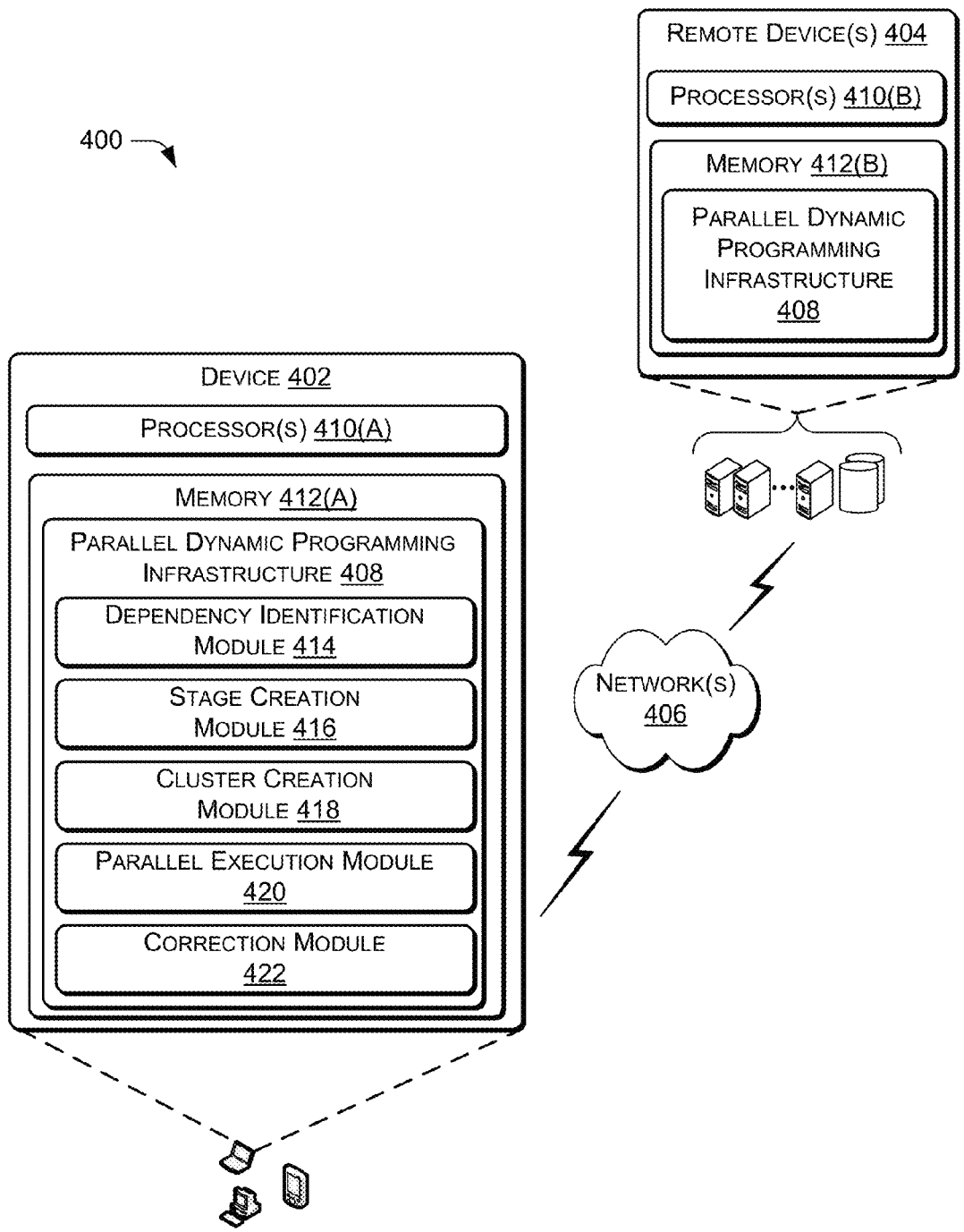
FIG. 4 illustrates an example environment that describes components of a device configured to implement the parallel dynamic programming across stages, in accordance with various embodiments.

FIG. 4 is a diagram showing an example environment 400 that implements the parallel dynamic programming across stages and/or clusters, as described above. In various embodiments, the parallelism for processing a dynamic programming problem (e.g., problem 102) may be implemented in a device 402 (e.g., a local device). In some embodiments, the parallelism for processing a dynamic programming problem may be implemented in a remote device 404 that communicates with the device 402 over one or more network(s) 406. In even further embodiments, the parallelism for processing may be implemented across the device 402 and the remote device 404, e.g., via the network(s) 406.

The device 402 and the remote device 404 may individually include, but are not limited to, any one of a variety of devices. For example, the device 402 and the remote device 404 may comprise a mobile or portable device such as a smart phone, a cellular phone, a personal digital assistant (PDA), an electronic book device, a laptop computer, a tablet computer, a portable computer, a gaming console, a personal media player device or the like. In another example, the device 402 and the remote device 404 may be a stationary device such as a desktop computer, a server computer (e.g., that is part of a cloud service or a server farm), a gaming console, a digital video recorder (DVR), a set top box or the like. The network(s) 406 may include the Internet, a Mobile Telephone Network (MTN) or other various communication technologies.

The device 402 includes parallel dynamic programming infrastructure 408 configured to implement the techniques described herein. The remote device 404 may individually, and separately, include parallel dynamic programming infrastructure 408. The device 402 and/or the remote device 404 may individually and separately include one or more processor(s) 410(A) and 410(B) (e.g., processing units 206(1) . . . 206(B)) and memory 412(A) and 412(B), respectively. The processor(s) 410(A) and 410(B) may be a single processing unit or a number of units, each of which could include multiple different processing units. The processor(s) 410(A) and 410(B) may include a microprocessor, a microcomputer, a microcontroller, a digital signal processor, a central processing unit (CPU), a graphics processing unit (GPU), a security processor etc. Alternatively, or in addition, some or all of the techniques described herein can be performed, at least in part, by one or more hardware logic components. For example, and without limitation, illustrative types of hardware logic components that can be used include a Field-programmable Gate Array (FPGA), an Application-specific Integrated Circuit (ASIC), an Application-specific Standard Products (ASSP), a state machine, a Complex Programmable Logic Device (CPLD), other logic circuitry, a system on chip (SoC), and/or any other devices that perform operations based on instructions. Among other capabilities, the processor(s) 410(A) and 410(B) may be configured to fetch and execute computer-readable instructions stored in the memory 412(A) and 412(B).

The memory 412(A) and 412(B) may include one or a combination of computer-readable media. As used herein, "computer-readable media" includes computer storage media and communication media.

Computer storage media includes volatile and non-volatile, removable and non-removable media implemented in any method or technology for storage of information, such as computer-readable instructions, data structures, program modules, or other data. Computer storage media includes, but is not limited to, phase change memory (PRAM), static random-access memory (SRAM), dynamic random-access memory (DRAM), other types of random access memory (RAM), read only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium that can be used to store information for access by a computing device.

In contrast, communication media includes computer-readable instructions, data structures, program modules, or other data in a modulated data signal, such as a carrier wave. As defined herein, computer storage media does not include communication media.

The memory 412(A) and 412(B) may include an operating system that is configured to manage hardware and services within and coupled to a device for the benefit of other modules, components and devices. In some instances, at least part of the parallel dynamic programming infrastructure 408 is implemented within, or by, the operating system.

In various embodiments, the parallel dynamic programming infrastructure 408 includes a dependency identification module 414. The dependency identification module 414 is configured to determine dependencies between the sub-problems of a dynamic programming problem. For instance, the dependency identification module may analyze a recurrence equation of the dynamic programming problem to determine that a sub-problem (e.g., a subsequent or next sub-problem) depends on a solution to another sub-problem (e.g., a current or previous sub-problem).

In various embodiments, the parallel dynamic programming infrastructure 408 includes a stage creation module 416. The stage creation module 416 is configured to generate stages based on the dependencies identified by the dependency identification module 414. For instance, the stage creation module may generate stages similar to those discussed in any one of FIGS. 1-3.

In various embodiments, the parallel dynamic programming infrastructure 408 includes a cluster creation module 418. The cluster creation module 418 is configured to generate clusters, where each cluster may include a group of stages (e.g., as show in FIG. 2). In various embodiments, the cluster creation module 418 generates a number of clusters that corresponds to a number of processing cores or processing units implemented on a device or multiple devices. In various embodiments, the cluster creation module 418 may generate clusters such that rank convergence ensures that solutions computed within a cluster based on a generated solution are close to or the same as solutions that would have been computed had the actual dependent solutions been used in the computations (e.g., the solutions become parallel to actual solutions in the later stages of the cluster). For instance, the cluster creation module 418 may determine that a threshold number of stages (e.g., five, ten, thirteen, twenty, etc.) is to be included in each cluster so that rank converges to "1", as further discussed herein. In some instances, a threshold number of stages may be determined by profiling or running training inputs to determine how quickly a particular LTDP problem is likely to converge. In some instances, a threshold number of stages may be determined by static analysis us to understand the rate of convergence by analyzing the properties of the LTDP algorithm.

In various embodiments, the parallel dynamic programming infrastructure 408 includes a parallel execution module 420. The parallel execution module 420 is configured to generate the generated solutions (e.g., one or more randomly generated values generated by a random value generator) to implement the parallel processing across stages and/or clusters.

In various embodiments, the parallel dynamic programming infrastructure 408 includes a correction module 422. The correction module 422 is configured to implement a "fix-up" phase. As further discussed herein, during the fix-up phase, the correction module 422 may compute the actual solutions (e.g., dependent solutions) and provide the dependent solutions to subsequent stages and/or clusters to correct any incorrect solutions computed using the generated solutions (e.g., the solutions to sub-problems included in stages sequentially positioned earlier in a cluster such as 202(4) and 202(7)). Accordingly, after the fix-up phase, the solutions computed using the generated solutions may mirror the actual solutions.

The modules described with respect to FIG. 4 may implement one or more parallel algorithms (e.g., example Algorithm 2 and/or example Algorithm 3 provided below) to efficiently parallelize a dynamic programming problem across stages and/or clusters. For example, the parallel algorithm may use rank convergence properties of matrix products in tropical semiring to break dependencies between stages of a dynamic programming problem, as further discussed herein.

Figure 5:
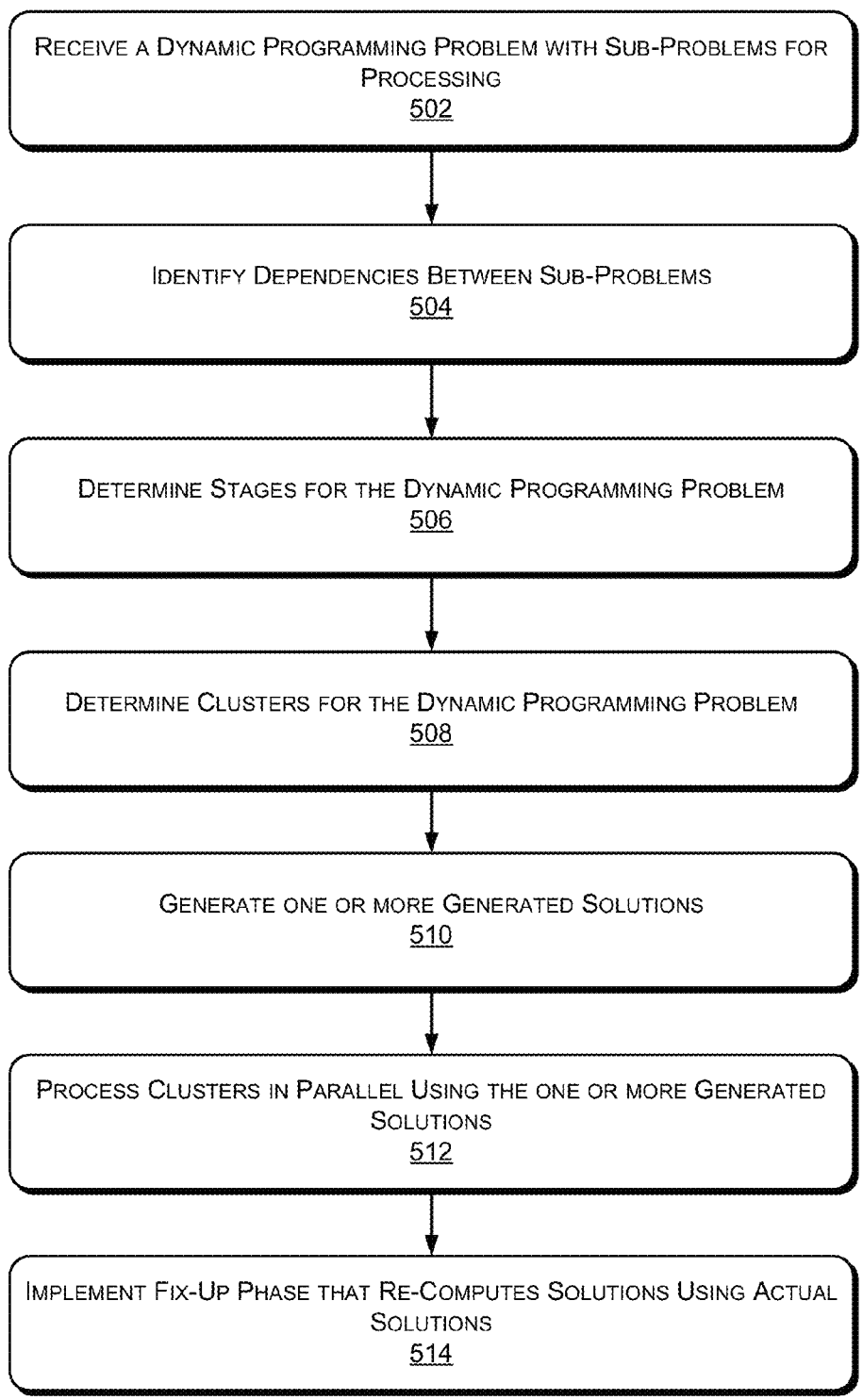
FIG. 5 illustrates an example process that parallel processes a dynamic programming problem across stages and/or clusters, in accordance with various embodiments.

FIG. 5 illustrates an example process depicted as a logical flow graph, which represents a sequence of operations that can be implemented in hardware, software, firmware, or a combination thereof. In the context of software, the operations represent computer-executable instructions that, when executed by one or more processors, configure a computing device to perform the recited operations. Generally, computer-executable instructions include routines, programs, objects, components, data structures, and the like that configure a computing device to perform particular functions or implement particular abstract data types. In some embodiments, any or all of the operations may be implemented in whole or in part by hardware (e.g., as an ASIC, a specialized processing unit, etc.) to execute the described functions. In some instances, the functions and/or modules are implemented as part of an operating system. In other instances, the functions and/or modules are implemented as part of a device driver, firmware, and so on.

The order in which the operations are described is not intended to be construed as a limitation, and any number of the described operations can be combined in any order and/or in parallel to implement the processes. The example operations in FIG. 5 may be described with reference to the modules, components and/or elements illustrated in any one of FIGS. 1-4.

FIG. 5 illustrates an example process 500 that parallel processes a dynamic programming problem across stages and/or clusters.

At 502, the parallel dynamic programming infrastructure 408 may receive a dynamic programming problem for processing. The dynamic programming problem includes multiple sub-problems individually configured to compute or calculate one or more values (e.g., a solution). The dynamic programming problem may be related to a Viterbi problem, a Needleman-Wunsch problem, a Smith-Waterman problem or a Longest Common Subsequence problem.

At 504, the dependency identification module 414 is configured to identify dependencies between the sub-problems of the dynamic programming problem. For instance, the dependency identification module 414 may analyze a recurrence equation of the dynamic programming problem to determine that a sub-problem (e.g., a subsequent or next sub-problem) depends on a solution to another sub-problem (e.g., a current or previous sub-problem).

At 506, the stage creation module 416 determines stages for the dynamic programming problem (e.g., by dividing the sub-problems into stages). As discussed above, an individual stage includes one or more sub-problems for which solutions can be computed independent of solutions to other sub-problems within the same stage. Put another way, two consecutive stages (e.g., stage 104(1) and stage 104(2), stage 202(1) and stage 202(2), stage 202(3) and stage 202(4), stage 202(6) and stage 202(7), etc.) are separated by at least one dependent solution. Accordingly, the stage creation module 416 separates and groups the sub-problems into stages.

At 508, the cluster creation module 418 determines clusters for the dynamic programming problem (e.g., by dividing the stages into clusters where at least two clusters can be parallel processed). For example, a first cluster (e.g., cluster 206(1)) may include a first group of stages (e.g., stages 202(1) through 202(3)) and a second cluster (e.g., cluster 206(2)) may include a second group of stages (e.g., stages 202(4) through 202(6)).

At 510, the parallel execution module 420 generates one or more generated solutions that are used so that the clusters can be parallel processed. For example, the parallel execution module 420 may generate an arbitrary solution (e.g., $as_1$ and $as_2$ in FIG. 2) for each cluster (e.g., clusters 204(2) and 204(A)) after a first cluster (e.g., cluster 204(1)). In various embodiments, a generated solution includes one or more random values generated by a random value generator. In another example, the parallel execution module 420 may use heuristics to generate solutions that may be used to compute subsequent solutions that may not require as much computation to correct or fix.

At 512, the parallel execution module 420 processes the clusters in parallel using the one or more generated solutions. For instance, the generated solutions can be used to compute solutions to sub-problems instead of the actual solutions that would have been computed (e.g., $s_1$ and $s_2$ in FIG. 2), and thus, parallel processing can be implemented because the stages in the subsequent clusters (e.g., clusters 204(2) and 204(A)) do not have to wait for the previous cluster to be executed so the actual solutions can be computed and provided.

In various embodiments, the parallel execution module 420 causes a processing unit or processing core (e.g., processing unit 206(1)) to sequentially process the stages in an individual cluster. For example, stage 202(1) is processed followed by stage 202(2) and then stage 202(3). Meanwhile, stage 204(4) is processed followed by stage 202(5) and then stage 202(6) (e.g., on a different processing unit or processing core such as processing unit 206(2)).

As further discussed herein, properties of rank convergence minimize error between the solutions to the sub-problems computed based on the generated solutions and the solutions to the sub-problems stages that would have been computed if the actual solutions to the sub-problems had been used.

At 514, the correction module 422 implements a fix-up phase that re-computes the solutions to the sub-problems using the actual solutions. For example, the fix-up phase may be implemented after the parallel processing of the first cluster and the second cluster using the generated solutions.

In various embodiments, as a group of stages (e.g., a cluster) is sequentially processed and executed, the parallel execution module 420 may compute the rank at each stage and determine at which stage the rank converges to one (e.g., identify a stage in a cluster sequence where the rank converges to one). The parallel execution module 420 may then fix-up or correct solutions computed before, or up to, the identified stage because solutions computed in stages after the identified stage where the rank converges to one are parallel (e.g., the same values or close to the same values) to actual or true solutions that would have been computed if the dependency had not been broken.

In various embodiments, the parallel dynamic programming infrastructure 408 may populate cells in table with the solutions computed in operations 512 and/or 514.

The following discussion describes support for the techniques and/or systems discussed above. For instance, the following discussion describes mathematics to help understand how a device (e.g., device 402 or device 404) can implement parallel processing of a dynamic programming problem across multiple stages and/or clusters. The following discussion may refer to elements, components, and/or operations, as described above with respect to any one of FIGS. 1-5.

In various embodiments, the techniques and/or systems described above are applicable to dynamic programming problems in which the dependencies between sub-problems are linear in tropical semiring. Thus, rank convergence properties of matrix products in tropical semiring can be used to break dependencies (e.g., dependent solution 112 and dependent solution 114 in FIG. 1 and $s_1$ and $s_2$ in FIG. 2). Put another way, a property of rank convergence that multiplies matrices shows that the rank converges to the value "1", which indicates the solutions computed using a generated solution are almost correct or very close to being correct, or correct.

In various embodiments, the techniques and/or systems described above break dependencies for a class of dynamic programming problems called linear-tropical dynamic programming (LTDP) problems. A dynamic programming problem may be linear-tropical if (i) the sub-problems of the dynamic programming problem can be divided and arranged into stages such that the solution to one or more sub-problems within a stage depends on at least one solution from a previous stage and (ii) the dependence is linear in tropical semirings. For example, the semiring may be formed with a "plus" (e.g., "+") as the multiplicative operator and a "max" as the additive operator. Put another way, a solution to sub-problem j in stage I, $s_i[j]$, of a LTDP problem, may be represented as follows:

$$s_i[j] = \max_k(s_{i-1}[k] + A_i[j,k])$$  equ. (1)

In equation (1), $A_i[j,k]$ may be constants derived from a recurrence equation (e.g., the recurrence equations of FIG. 3 pointed to by 306 and 308).

In various embodiments, the linear dependence in equation (1) provides a view of a sequential LTDP computation as one that performs repeated matrix-vector multiplications in a tropical semiring. For example, each stage may be a vector and the solutions for a stage i may be represented as follows:

$$\vec{s}_i = A_i \odot \vec{s}_{i-1}$$  equ. (2)

In equation (2), $A_i$ may be a matrix of constants derived from the recurrence equation, for example. Therefore, starting from an initial solution vector $\vec{s}_0$, the solution at stage n can be obtained and represented as follows:

$$\vec{s}_n = A_n \odot A_{n-1} \ldots A_2 \odot A_1 \odot \vec{s}_0$$  equ. (3)

Dependencies between stages can be broken by exploiting the associativity of matrix multiplication. For instance, two processors may compute the partial products $$A_n \odot \ldots \odot A_{\frac{n}{2}+1} \text{ and } A_{n/2} \odot \ldots \odot A_1$$

in parallel, and multiply the results with $\vec{s}_0$ to obtain $\vec{s}_n$. However, doing so converts a sequential computation that performs matrix-vector multiplications to a parallel computation that performs matrix-matrix multiplications. This often results in parallelization overhead linear to a size of a stage that may use a linear number of processors to observe an improvement in processing speed, which may not be practical for device hardware.

The techniques and/or systems described herein do not rely on matrix-matrix multiplication, and therefore, the overhead of matrix-matrix multiplication is eliminated. Instead, techniques and/or systems described herein rely on properties of LTDP. For example, in a first property, the output of LTDP may not change if a constant is added to the solutions in a stage because finding a solution, e.g., the LCS of two strings or the optimal sequence of Hidden Markov Model (HMM) states in Viterbi, may be based on finding predecessors of each problem which is the sub-problem for which the maximum is reached in equation (1). The predecessors of sub-problems in a stage may remain invariant if a constant is added to the solutions in the previous stage, and therefore, vectors, whose entries differ by a constant, may be referred to as being parallel to each other. In some embodiments, this corresponds to scalar multiplication in tropical semiring. In a second property, rank convergence is used to compute solutions (e.g., based on generated solutions) that are close to, but may not be the same as the actual solutions. For instance, the rank of a product of k matrices may converge to the value "1" for a large enough k. An interesting property of a rank "1" matrix, A, is that for any two vectors $\vec{u}$ and $\vec{v}$, $A \odot \vec{u}$ and $A \odot \vec{v}$ may be parallel to each other.

In linear algebra, a matrix-vector multiplication maps a vector from an input n-dimensional space to an output m-dimensional space. If the matrix is of low rank, the matrix projects the vector to a subspace of the output space. For example, if the matrix has rank "1", then it may map input vectors to a line in the output space. In various embodiments, these geometric intuitions may hold even when the meaning of the sum and multiplication operators is changed from their normal semantics (e.g., change to "max" and "+" respectively), as long as the meaning satisfies the following rules.

A semiring may be a five-tuple $(D, \oplus, \otimes, \mathbb{0}, \mathbb{1})$ where D may be the domain of the semiring that may be closed under the additive operation, $\oplus$, and the multiplicative operation, $\oplus$. The two operations may satisfy the following properties:

$(D, \oplus, \mathbb{0})$ forms a commutative monoid with $\mathbb{0}$ as an identity associativity: $\forall x, y, z \in D: (x \oplus y) \oplus z = x \oplus (y \oplus z)$ identity: $\forall x \in D: x \oplus \mathbb{0} = x$ commutativity: $\forall x, y \in D: x \oplus y = y \oplus x$ $(D, \otimes, \mathbb{1})$ forms a commutative monoid with $\mathbb{1}$ as an identity associativity: $\forall x, y, z \in D: (x \otimes y) \otimes z = x \otimes (y \otimes z)$ identity: $\forall x \in D: x \otimes \mathbb{1} = \mathbb{1} \otimes x = x$ $\otimes$ left- and right-distributes over $\oplus$ $\forall x, y, z \in D: x \otimes (y \oplus z) = (x \otimes y) \oplus (x \otimes z)$ $\forall x, y, z \in D: (y \oplus z) \otimes x = (y \otimes x) \oplus (z \otimes x)$ $\mathbb{0}$ is an annihilator for $\otimes$ $\forall x \in D: x \otimes \mathbb{0} = \mathbb{0} \otimes x = \mathbb{0}$ The tropical semiring may be the following semiring:

$(\mathbb{R} \cup \{-\infty\}, \max, +, -\infty, 0)$ with the real numbers extended with $-\infty$ as the domain, "max" as the additive operation $\oplus$, and "+" as the multiplicative operation $\otimes$. In some examples, all properties of a semiring may hold with $-\infty$ as the additive identity $\mathbb{0}$ and 0 as the multiplicative identity $\mathbb{1}$.

Matrix Multiplication in Tropical Semiring

Let $A_{n \times m}$ denote a matrix with n rows and m columns with elements from the domain of the tropical semiring. Let A[i, j] denote the element of A at the ith row and jth column. The matrix product of $A_{l \times m}$ and $B_{m \times n}$ is $A \odot B$, a l×n matrix may be defined as follows:

$$(A \odot B)[i, j] = \bigoplus_{1 \leq k \leq m} (A[i, k] \otimes B[k, j]) \qquad \text{equ. (4)}$$

$$(A \odot B)[i, j] = \max_{1 \leq k \leq m} (A[i, k] + B[k, j]) \qquad \text{equ. (5)}$$

In some implementations, this may be the standard matrix product with multiplication replaced by "+" and addition replaced by "max".

The transpose of $A_{n \times m}$ is the matrix $A_{m \times n}^T$ such that $\forall i, j$: $A^T[i, j] = A[j, i]$. The $v_{n \times 1}$ matrix can then be denoted as the column vector $\vec{v}$, a $v_{1 \times n}$ matrix as the row vector $\vec{v}^T$, and $x_{1 \times 1}$ matrix as the scalar x. The matrix-matrix multiplication above may be extended to matrix-vector, scalar-matrix, and scalar-vector multiplication. Also, the ith element of a vector $\vec{v}$ may be given by $\vec{v}[i]$.

From the discussion above, it follows that:

$$(A \odot \vec{v})[i] = \max_k (A[i, k] + \vec{v}[k]) \qquad \text{equ. (6)}$$

Comparing equation (6) with equation (1), it can be seen that computing the solutions in a stage of a dynamic programming problem (e.g., a LTDP problem) can be viewed as a matrix-vector multiplication.

Lemma 1 follows the associativity, distributivity, and commutativity properties of $\otimes$ and $\oplus$ in a semiring.

Lemma 1.

Matrix multiplication may be associative in semirings:

$$(A \odot B) \odot C = A \odot (B \odot C) \qquad \text{equ. (7)}$$

Rank of a Tropical Matrix.

A matrix $M_{m \times n}$ is of rank r, denoted by rank (M)=r, if r is the smallest number such that $M = C_{m \times r} \odot R_{r \times n}$. For example, a rank "1" matrix may be a product of a column vector and a row vector. There may be alternate ways to define the rank of a matrix in semirings, such as the number of linearly independent rows or columns in a matrix. While such definitions may coincide in rings, they may not be equivalent in semirings.

Rank Convergence.

At least one property of rank is that it is non-increasing during matrix multiplication.

$$\text{rank}(A \odot B) \leq \min(\text{rank}(A), \text{rank}(B)) \qquad \text{equ. (8)}$$

For example, if rank(A)=r, then A=C⊙R for a matrix C with r columns. Thus, $A \odot B = (C \odot R) \odot B = C \odot (R \odot B)$ implying that rank $(A \odot B) \leq$ rank(A). Similar argument may show that rank$(A \odot B) \leq$ rank(B).

This rank convergence property implies that when one is performing a sequence of matrix multiplications, the rank of the product may continue to decrease or remain the same. In some instances, the techniques and/or systems described herein rely on the rank of a product to converge to "1" (e.g., as stages within a cluster are processed as discussed above with respect to FIG. 2).

Parallel Vectors.

Two vectors $\vec{u}$ and $\vec{v}$ are parallel in tropical semiring, denoted as $\vec{u} \| \vec{v}$, if there exist scalars x and y such that $\vec{v} \odot x = \vec{u} \odot y$ (e.g., scalar multiplication). The two scalars may be multiplicative inverses and may not be guaranteed in semirings. Parallel vectors in tropical semiring $\vec{u}$ and $\vec{v}$ may differ by a constant offset. For instance, $[1\ 0\ 2]^T$ and $[3\ 2\ 4]^T$ may be parallel vectors differing by an offset "2". In various embodiments, Lemma 2 follows from Lemma 1.

Lemma 2.

$\vec{u} \| \vec{v} \Rightarrow A \odot \vec{u} \| A \odot \vec{v}$.

In various embodiments, Lemma 3 shows that a rank "1" matrix may map vectors to a line.

Lemma 3.

Given a matrix A of rank "1", $A \odot \vec{u} \| A \odot \vec{v}$ for all vectors $\vec{u}$ and $\vec{v}$.

If rank (A)=1, then it is a product of some column vector e and a row vector $\vec{r}^T$. For any vectors $\vec{u}$ and $\vec{v}$, it follows that:

$$A \odot \vec{u} = (\vec{c} \odot \vec{r}^T) \odot \vec{u} = \vec{c} \odot (\vec{r}^T \odot \vec{u}) = \vec{c} \odot x_u \qquad \text{equ. (9)}$$

$$A \odot \vec{v} = (\vec{c} \odot \vec{r}^T) \odot \vec{v} = \vec{c} \odot (\vec{r}^T \odot \vec{v}) = \vec{c} \odot x_v \qquad \text{equ. (10)}$$

for scalars $x_u$ and $x_v$. As an example, consider the following:

$$A = \begin{bmatrix} 1 & 2 & 3 \\ 2 & 3 & 4 \\ 3 & 4 & 5 \end{bmatrix}$$

$$\vec{u} = \begin{bmatrix} 1 \\ -\infty \\ 3 \end{bmatrix}$$

$$\vec{v} = \begin{bmatrix} -\infty \\ 2 \\ 0 \end{bmatrix}$$

Here, A is rank "1" as $A[1\ 2\ 3]^T \odot [0\ 1\ 2]$. $A \odot \vec{u} = [6\ 7\ 8]^T$ and $A \odot \vec{v} = [4\ 5\ 6]^T$ which are parallel with a constant offset "2".

All-Non-Zero Invariance.

A vector is all-non-zero if none of its elements are $\mathbb{0} = -\infty$. In some implementations, the techniques and/or systems described herein may use the fact that matrices, A, seen in LTDP instances have the property that $A \odot \vec{v}$ is all-non-zero whenever $\vec{v}$ is all-non-zero.

In equation (1), for example, the j row of matrix $A_i$ may capture how the sub-problem j in stage i depends on the sub-problems in stage i−1. In some instances, if all entries in this row are −∞, then the sub-problem j is forced to be −∞ for any solution to stage i−1. Such trivial sub-problems may be removed from a given LTDP instance. An LTDP instance may be non-trivial if it does not contain any trivial sub-problems.

Lemma 4.

For a matrix A from a non-trivial LTDP instance, $\vec{v}$ is all non-zero $\Rightarrow A \odot \vec{v}$ is all non-zero, and $(A \odot \vec{v})[i] = \max_k(A[i,k] + \vec{v}[k])$, but $A[i,k] \neq -\infty$ for some k ensuring that at least one of the arguments to "max" is not −∞. This may rely on the fact that no element has an inverse under "max", except −∞. As such Lemma 4 may not be true in other semirings.

LTDP algorithms may identify the predecessor for each problem, which may be the sub-problem for which the maximum in equation (1) is reached. For ease of exposition, the predecessor product of $A_{l \times m}$ and $A_{m \times n}$ may be defined as A*B, a l×n matrix as follows:

$$(A \star B)[i, j] = \operatorname*{argmax}_{1 \leq k \leq m} (A[i, k] + B[k, j]) \quad \text{equ. (11)}$$

Accordingly, in some instances, there may be a similarity between the definition of matrix multiplication in tropical semiring and the definition of predecessor product. In some implementations, this definition may extend to matrix-vector, scalar-matrix, and scalar-vector predecessor products.

Lemma 5 relies on the fact that "arg max" may be invariant when a constant offset is added to all its arguments.

Lemma 5.

$$\vec{u} \| \vec{v} \Rightarrow \forall A: A \star \vec{u} = A \star \vec{v} \quad \text{equ. (12)}$$

Lemma 6 follows from Lemma 5 as all rows in a rank "1" matrix may be parallel to each other.

Lemma 6. For a matrix A of rank "1" and any vector $\vec{v}$, all elements of $A \star \vec{v}$ are equal.

A first example algorithm (e.g., Algorithm 1) described herein is a sequential algorithm for dynamic programming problems (e.g., LTDP problems). Algorithm 1 is described using matrix-vector multiplication as an example. Then, the example matrix-vector multiplication is extended to one or more example parallel LTDP algorithms (e.g., Algorithm 2 and Algorithm 3). In various embodiments, example Algorithm 1, example Algorithm 2 and/or example Algorithm 3 may be implemented at least in part by the modules of the parallel dynamic programming infrastructure 408, in FIG. 4, to implement the process of FIG. 5 and/or FIG. 6, as well as the techniques described in any one of FIGS. 1-3.

Algorithm 1, the example sequential algorithm for dynamic programming problems (e.g., LTDP problems) that computes stages sequentially, is provided herein (e.g., the numbers on the left indicating a line in the algorithm):

```
1    LTDP_Seq (vector s₀, matrix A₁ .. Aₙ) {
2        vector pred [1 .. n]; vector res;
```

-continued

```
3        // forward
4        s = s₀;
5        for i in (1 .. n) {
6            pred [i] = Aᵢ ★ s;   // pred [i] = p⃗ᵢ
7            s       = Aᵢ ⊙ s; // s = s⃗ᵢ
8        }
9        //backward
10       res [n+1] = 0;  // res = r⃗
11       for i in (n .. 1) {
12           res [i] = pred [i] [res [i + 1]];    }
13       return res;                              }
```

Algorithm 1 includes a "forward" phase that may compute the solutions in each stage $\vec{s}_i$ iteratively. Moreover, Algorithm 1 may compute the predecessor product $\vec{p}_i$ that may determine, for each solution in a stage, the sub-problem (e.g., its "predecessor") for which the maximum is reached in equation (1). Then, in an example "backward" phase subsequent to the forward phase, Algorithm 1 may recursively read the predecessors starting from the first solution in $\vec{s}_n$. The resulting vector $\vec{r}$ (e.g., "res" in Algorithm 1 above) is the solution to the optimization problem (e.g., the longest-common-subsequence of two input strings).

Some implementations may not represent the solutions in a stage as a vector and perform matrix-vector operations. In some instances, it may be known that a current solution may not depend on all sub-problems in the previous stage. In some instances, solutions in a stage may be computed in parallel.

Algorithm 2 is an example parallel algorithm that implements parallelism across stages for dynamic programming problems (e.g., LTDP problems). For instance, Algorithm 2 parallelizes both the forward phase and the backward phase of the sequential algorithm for dynamic programming problems (e.g., Algorithm 1). Moreover, Algorithm 2 relies upon rank convergence for efficiency. Algorithm 2 is provided herein (e.g., with numbers on the left indicating a line within the algorithm):

```
1    LTDP_Par (vector s₀, matrix A₁ .. Aₙ) {
2        vector s [1 .. n]; vector pred [1 .. n];
3        vector conv;
4        // proc p owns stages (1ₚ .. rₚ]
5        ∀p : 1ₚ = n / P * (p − 1); rₚ = n / P * p;
6        // parallel forward phase
7        parallel . for p in (1 .. P) {
8            local s = ( p == 1 ? s₀ : nz);
9            for i in (1ₚ + 1 .. rₚ) {
10               pred [i] = Aᵢ ★ s;
11               s = s[i] = Aᵢ ⊙ s; }}
12       -------- barrier --------
13       do { // until convergence (fix up loop)
14           parallel . for p in (2 .. P) {
15               conv [p] = false;
16               // obtain final solution from prev proc
17               s = s [1ₚ]
18               for i in (1ₚ + 1 .. rₚ) {
19                   pred [i] = Aᵢ ★ s;
20                   s       = Aᵢ ⊙ s;
21                   if (s is parallel to s[i] ) {
22                       conv [p] = true;
23                       break;              }
24                   s[i] = s;              }}
25           -------- barrier --------
26           conv = Λₚ conv[p];
27       } while (!conv);
28
29       // parallel backward phase is described in Algorithm 3
30       return Backward_Par (pred);              }
```

In Algorithm 2, lines 12, 17 and 25 may comprise interprocessor communications. Given the initial solution vector $\vec{s}_0$ and n matrices $A_1, \ldots, A_n$, Algorithm 1 computes $\vec{s}_i = A_i \odot \vec{s}_{i-1}$ for stages i. However, the parallel forward phase in Algorithm 2 may compute a solution s[i] at stage i that may be parallel to the actual solution $\vec{s}_i$ (e.g., dependent solution 112 and/or dependent solution 114 from FIG. 1 and/or $s_1$ and $s_2$ from FIG. 2).

One example insight of Algorithm 2 is that computing an exact solution may not be necessary for a dynamic programming problem (e.g., an LTDP problem). For example, since parallel vectors may differ by a constant in tropical semiring, the predecessors of the solutions in a subsequent or next stage i+1 may remain invariant (e.g., Lemma 5). During the execution of Algorithm 2, the stage i may converge if s[i] computed by the algorithm is parallel to its actual solution $\vec{s}_i$.

In various embodiments, Algorithm 2 may split stages equally among P processors such that a processor p owns stages between $l_p$ (exclusive) and $r_p$ (inclusive), as shown in line 5 of Algorithm 2. Thus, while a first processor starts computing from $\vec{s}_0$, other processors may start from some all-non-zero vector "nz" (e.g., a generated "arbitrary" solution), as shown in line 8 of Algorithm 2. In some instances, the loop starting in line 9 of Algorithm 2 may be similar to the sequential forward phase of Algorithm 1 except that the parallel version of Algorithm 2 may store the computed s[i] used in a convergence loop, as further discussed herein.

For example, consider a processor p≠1 that owns stages $(l_p \ldots r_p]$. For a stage k owned by p, let $M_k$, the partial product at stage k be $A_k \odot \ldots A_{l_p+2} \odot A_{l_p+1}$. If there exists a stage k for which rank($M_k$) is "1", then s[k] is parallel to $\vec{s}_k = M_k \odot \vec{s}_{l_p}$, irrespective of the initial vector "nz" (e.g., Lemma 3). In some implementations, a constraint of "nz" being all-non-zero may ensure that this property is not true because otherwise s[k] could be a zero-vector whose elements are all $-\infty$ (e.g., Lemma 4). If rank($M_k$) is "1", then rank(M) is "1" for every i>k, thereby indicating that the stages have converged (e.g., within a cluster).

In example Algorithm 2, a fix up loop starts at line 13 and fixes stages i<k. In the fix up loop, processor p communicates with the previous processor p−1 that owns stage $l_p$ to obtain s[$l_p$] (e.g., line 17 in Algorithm 2). The fix up loop may then continue to update s[i] for all stages until the new value becomes parallel to the old value of s[i] (e.g., line 21 in Algorithm 2). This may ensure that all stages owned by p have converged in accordance with an assumption that stage $l_p$ has converged.

Moreover, if the Boolean variable conv[p] in Algorithm 2 is true, then processor p advertised a converged value of s[$r_p$] to processor p+1 at the beginning of the iteration. Thus, when cony at line 26 in Algorithm 2 is true, all stages have converged. In one example, there may be a stage k for every processor p such that rank($M_k$) is "1", and thus, the fix up loop in Algorithm 2 may execute exactly one iteration.

However, if conv[p] in Algorithm 2 is not true for the processor p, then the range of stages $(l_p \ldots r_p]$ may not be large enough to generate a partial product with rank "1". Processor p+1 in the next iteration of the fix up loop starts from s[$r_p$](=s[$l_{p+1}$]) and, searches for a partial product with rank "1" in the wider range $(l_p \ldots r_{p+1}]$. The fix up loop may terminate if all processors are able to converge in this wider range. In a worst case scenario, the fix up loop may execute P−1 iterations and Algorithm 2 devolves to the sequential example of Algorithm 1. In some embodiments, this may happen when the entire product $A_n \odot \ldots A_{l_p+1}$ has a rank greater than "1".

In some instances, even though the discussion above uses the partial product $M_k$ in its arguments, Algorithm 2 may not perform any matrix-matrix multiplications. Also, Algorithm 2 may directly use the sequential implementation (e.g., Algorithm 1) to perform the * and $\odot$ operations (e.g., in lines 10, 11, 19, and 20). In other words, Algorithm 2 may use an optimized sequential implementation for the * and $\odot$ operations, respectively.

In various embodiments, line 26 in Algorithm 2 computes a conjunction of conv[p] Boolean variable for all processors. This is an example reduce operation that may be parallelized, if needed.

When compared to the sequential algorithm (e.g., Algorithm 1), the parallel algorithm (e.g., Algorithm 2) may additionally store s[i] per stage that tests for convergence in the convergence-loop. If space is a constraint, then in some implementations the fix up loop can be modified to recompute s[i] in each iteration, trading compute for space.

In various embodiments, once the parallel forward phase is completed, performing the sequential backward phase from Algorithm 1 may generate the right result, even though s[i] may not be exactly the same as the correct solution $\vec{s}_i$. In various implementations, the forward phase may dominate the execution time and parallelizing the backward phase may not be necessary. If this is not the case, the backward phase can be parallelized using the same idea as the parallel forward phase as described below. Algorithm 3 is another example parallel algorithm for the backward phase, and is provided herein (e.g., with numbers on the left representing lines within Algorithm 3):

```
1       Backward_Par (vector pred [1 .. n]) {
2           vector res; vector conv;
3           // proc p owns stages (l_p .. r_p]
4           ∀p : l_p = n / P * (p − 1); r_p = n / P * p;
5           // parallel backward phase
6           parallel . for p in (P .. 1) {
7               // all processors start from 0
8               local x = 0;
9               for i in (r_p .. l_p + 1) {
10                  x = res [i] = pred [i] [x]; }}
11          ------- barrier --------
12          do { // ubtil convergence (fix up loop)
13              parallel . for p in (P − 1 .. 1)) {
14                  conv [p] = false;
15                  // obtain final solution from next proc
16                  local x = res [r_p + 1];
17                  for i in (r_p .. l_p + 1) {
18                      x = pred [i] [x];
19                      if (res [i] == x)
20                          conv [p] = true;
21                          break;            }
22                      res [i] = x;          }
23              ------- barrier --------
24              conv = ∧_p conv[p];
25          } while (!conv);
36          return res;                       }
```

In various embodiments, the backward phase recursively identifies the predecessor at stage i starting from stage n. One example way to obtain this predecessor is by iteratively looking up the predecessor products pred[i] computed during the forward phase. Another example way to obtain this predecessor is through repeated matrix multiplication $M_i * \vec{s}_i$, where $M_i$ is the partial product $A_n \odot \ldots A_{i+1}$. Based on a rank convergence argument, the rank of may converge to "1" for large enough i. From Lemma 6, the predecessor at stages beyond i may not depend on the initial value used for the backward phase.

Example Algorithm 3 uses the insight from the previous paragraph to implement a parallel backward phase. For example, each processor starts the predecessor traversal from 0 (e.g., line 8 in Algorithm 3) on the stages it owns. Each processor enters a fix up loop whose description and correctness mirror those of the forward phase discussed above with respect to Algorithm 2.

In various embodiments, solving an LTDP problem can be viewed as computing the shortest and/or longest paths in an example graph. In the example graph, each sub-problem may be a node and directed edges may represent the dependencies between sub-problems. The weights on edges represent the constants A[j, k] in equation (1). In LCS for instance (e.g., element 304 of FIG. 3), each sub-problem has incoming edges with weight "0" from the sub-problem above and to its left, and an incoming edge with weight $\delta_{i,j}$ from its diagonal neighbor. Finding an optimal solution to the LTDP problem may be based on finding the longest path in this graph from the sub-problem "0" in the last stage to sub-problems in the first stage, given initial weights to the latter. In alternate implementations, the weights can be negated and the "max" can be changed to a "min" in equation (1) to view this as computing shortest paths.

Entries in the matrix product $A_l \odot A_{l+1} \ldots A_r$ may represent a cost of the shortest or longest path from a node in a first stage to a node in stage r. The rank of this product is "1" if these shortest paths go through a single node in some stage between the first stage and stage r. As an example, a network of roads across the United States may have this property. For instance, the fastest path from any city in Washington to any city in Massachusetts is highly likely to go through Interstate 90 (I-90) that connects Washington to Massachusetts. For a trip from Washington to Massachusetts, routes that use I-90 are better than routes that do not use I-90. Therefore, a choice of a city at the beginning (e.g., a city in Washington where the drive begins) and/or a city at the end (e.g., a city in Massachusetts where the drive ends) do not drastically change how intermediate roads, e.g., stages, are routed. Therefore, if problem instances have optimal solutions that are better than other solutions, rank convergence can be expected.

The example fix up loop in Algorithm 2 and/or Algorithm 3 may compute solutions s[i] for the initial stages for each processor (e.g., 202(4) and 202(7) in FIG. 2). The ranks of the partial products may converge to a small or low rank faster than to a rank of "1". Intuitively, the old and new values of s[i] may be almost parallel to each other for the low-rank stages, but the fix up loop may still redundantly update the solutions to reflect the actual solutions based on dependencies.

In one example, the computations to redundantly update the solutions may be optimized using delta computation. For instance, consider parallel vectors $[1, 2, 3, 4]^T$ and $[3, 4, 5, 6]^T$. Instead, if the vector is represented as the delta between adjacent entries along with the first entry, these vectors, represented as $[1, 1, 1, 1]^T$ and $[3, 1, 1, 1]^T$, may be exactly the same except for the first entry. Extending this intuition, if the partial-product at a stage is a low-rank, some, but not all, of the entries in the vectors may be the same when represented as deltas. If recurrence equation (1) is modified to operate on deltas, then the deltas that are different between the old and new values of s[i] may be propagated to the next iteration. This optimization may be helpful for instances, such as LCS and Needleman-Wunsch, for which a number of solutions in a stage is large and the convergence to low-rank is faster than the convergence to rank "1".

In various embodiments, dynamic programming problems can be reformulated as LTDP problems. The reformulation groups sub-problems into stages such that each stage depends on exactly one previous stage so that the dependence between stages is of the same form as equation (1).

While the discussion herein applies to four dynamic programming problems, the techniques and/or systems described herein may also apply to other dynamic programming problems.

Viterbi.

The Viterbi algorithm finds the most likely sequence of states in a hidden Markov model (HMM). A HMM includes a set of hidden states named 0, 1, ... n, a set of observables O, transition probabilities $t_{i,j}$ of transitioning from state i to state j, and emission probabilities $e_{i,o}$ of emitting observation $o \in O$ from state i.

Given a HMM and a sequence of observations $o_1, o_2, \ldots, o_T$, the Viterbi algorithm finds the most likely sequence of hidden states that explains the observations using dynamic programming. For instance, let $\vec{q}_t$ be a vector of probabilities such that $\vec{q}_t[j]$ is the probability of the most probable state sequence that explains the first t observations $o_1, \ldots, o_t$ and ends in state j. If $\vec{q}_0$ represents the initial probabilities of the HMM states at t=0, $\vec{q}_t$ for t>0 may be given by the following recurrence:

$$\vec{q}_t[j] = e_{j,o_t} \cdot \max_k(\vec{q}_{t-1}[k] \cdot t_{k,j}) \qquad \text{equ. (13)}$$

The recurrence in equation (13) may use the property that if the most likely sequence that explains the first t observations and ends at state j goes through state k at t−1, then its prefix of length t−1 may be the most likely sequence that explains the first t−1 observations and ends at state k. This optimal substructure may be associated with dynamic programming problems.

To reformulate Viterbi as LTDP, logarithms can be applied on both sides of equation (13). For instance, if $\vec{s}_t$ is an element-wise logarithm of $\vec{q}_t$, then it follows that:

$$\vec{s}_t[j] = \max_k(\vec{s}_{t-1}[k] + \log(e_{j,o_t} \cdot t_{k,j})) \qquad \text{equ. (14)}$$

If $A_t$ is the matrix such that $A_t[j,k] = \log(e_{j,o_t} \cdot t_{k,j})$, then the recurrence in equation (14) matches equation (1), a form for LTDP. Some implementations may use log probabilities and addition rather than manipulating probabilities with floating-point multiplication for efficiency and for numerical stability.

Once $\vec{s}_T$ is known using equation (14), the backward phase from the maximum value in $\vec{s}_T$ may be started to determine the most likely sequence to any HMM state. Thus, a matrix $A_{T+1}$ with 0 in all entries may be introduced. And, $\vec{s}_{T+1} = A_{T+1} \odot \vec{s}_T$ has the probability of most likely sequence as its first entry (and all other entries). Invoking example Algorithm 1 with $\vec{s}_0$ and matrices $A_1, \ldots, A_{T+1}$ as defined above generates the most likely sequence for the given sequence of observations.

Longest Common Subsequence (LCS).

A string S may be a subsequence of another string A, if deleting, e.g., possibly non-contiguous, characters from A results in S. Given two strings A and B, the longest common sequence (LCS) of A and B is the longest string S that is a subsequence of both A and B. A manifestation of this problem is the "diff" utility that finds the minimum edits between two files from their LCS.

LCS has a substructure as follows. Say, S is the LCS of A and B. Let A=A'.a and B=B'.b, where a and b are the respective last characters of A and B. If a=b, then S can be obtained by appending a to the LCS of A' and B'. Otherwise, there are two cases depending on whether a or b or neither is present in S. Respectively, S is the longest of the LCS of A'a and B', LCS of A' and B'b, and LCS of A' and B'. The following recurrence captures these cases:

$$l_{i,j} = \max \begin{cases} l_{i-1,j-1} + \delta_{i,j} \\ l_{i-1,j} \\ l_{i,j-1} \end{cases} \quad \text{equ. (15)}$$

Here, $l_{i,j}$ is the length of the LCS of the first i characters in A and the first j characters of B, and $\delta_{i,j}$ is one (e.g., "1") if the ith character in A is the same as the jth character in B and zero otherwise. This dependence is visualized in FIG. 3 with respect to the LCS table. The solution of the LCS may be obtained by following the predecessors from the bottom-rightmost entry in the table.

In various embodiments, some applications may be interested in solutions that are at most a width w away from a main diagonal, thereby ensuring that the LCS is similar to the input strings. For these applications, the recurrence relation may be modified such that $l_{i,j}$ is set to $-\infty$ whenever $|i-j|>w$. Using a smaller width may also reduce the memory requirements of LTDP as the entire table does not have to be stored in memory.

Figure 6:
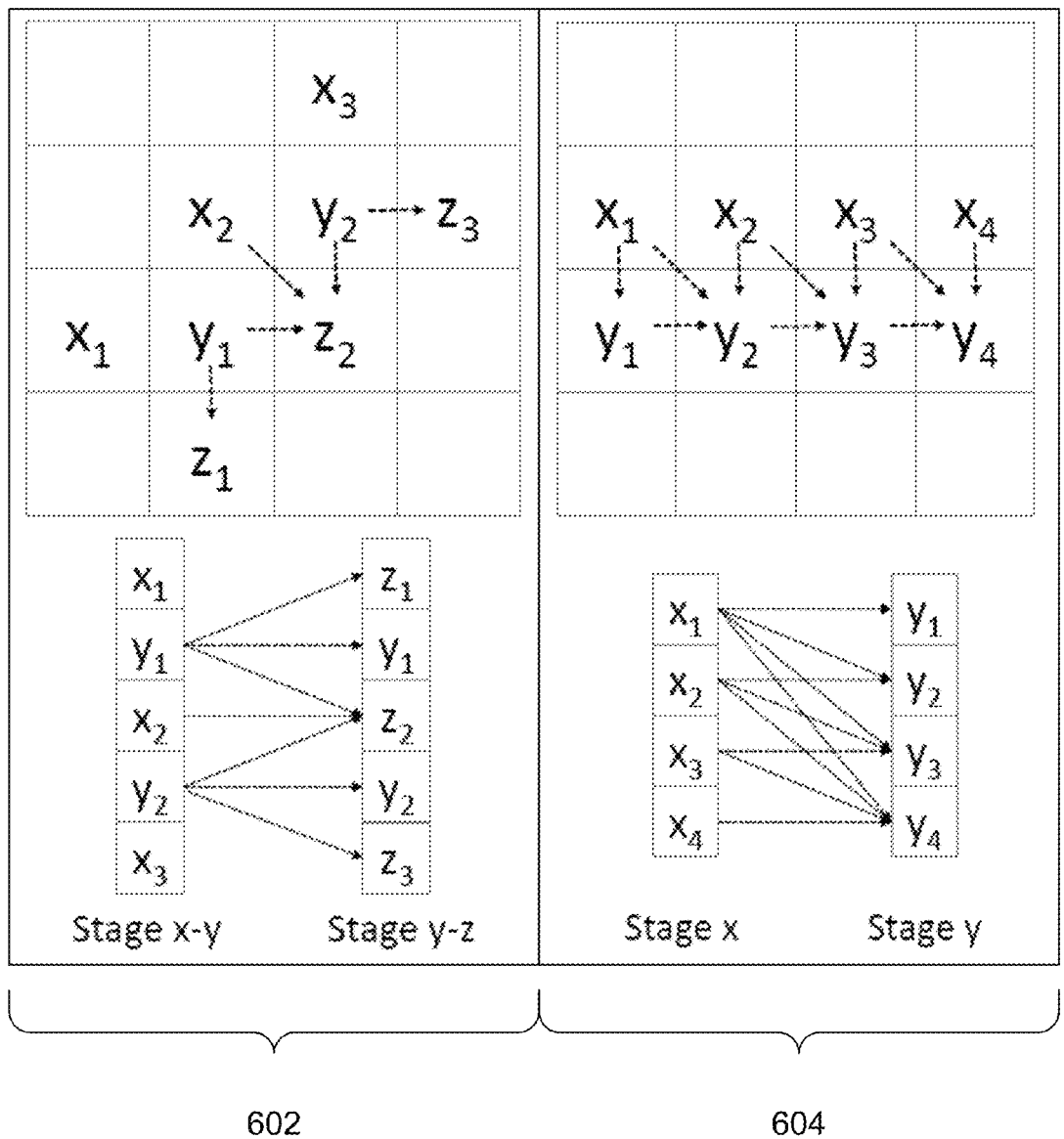
FIG. 6 illustrates an example diagram that groups the sub-problems of a longest common subsequence (LCS) problem into stages, in accordance with various embodiments.

Grouping the sub-problems of LCS into stages may be done in either one of two example approaches, as shown in FIG. 6. In the first example approach 602, the stages correspond to anti-diagonals, such as the $z_i$s anti-diagonal stage that depends on two previous stages (e.g., the $x_i$s anti-diagonal stage and the $y_i$s anti-diagonal stage). Accordingly, the stages may be defined as overlapping pairs of anti-diagonals, like stages x-y and stage y-z. Sub-problems $y_i$s (e.g., $y_1$ and $y_2$) may be replicated in both stages, allowing stage y-z to depend on stage x-y. While this representation may have a downside of doubling the size of each stage, it may lead to efficient representation. For LCS, the difference between solutions to consecutive sub-problems in a stage may either be one (e.g., "1") or zero. This is conducive to representing the stage as a sequence of bits.

In the second example approach 604, the stages correspond to rows or, alternatively, columns. The recurrence in 604 may be unrolled to avoid dependencies between sub-problems within a stage. For instance, y, depends on all $x_j$ for $j \le i$. In the second example approach 604, the final solution is obtained from the last entry, and thus, the predecessor traversal in Algorithm 2 may be modified to start from this entry, e.g., by adding an additional matrix at the end to move this solution to the first solution in the added stage.

Needleman-Wunsch: Global Sequence Alignment.

Needleman-Wunsch performs a global alignment of two input sequences and is commonly used in bioinformatics to align protein or DNA sequences. The recurrence equation is as follows:

$$s_{i,j} = \max \begin{cases} s_{i-1,j-1} + m[i, j] \\ s_{i-1,j} - d \\ s_{i,j-1} - d \end{cases} \quad \text{equ. (16)}$$

In equation (16), $s_{i,j}$ is the score of the best alignment for the prefix of length i of the first input and the prefix of length j of the second input, m[i, j] is the matching score for aligning the last characters of the respective prefixes, and d is a penalty for an insertion or deletion during alignment. The base cases may be defined as $s_{i,0} = -i*d$ and $s_{0,j} = -j*d$.

In various embodiments, grouping sub-problems into stages may be done using the same approach as in LCS. Thus, in some instances, one can think of LCS as an instance of Needleman-Wunsch for appropriate values of matching scores and insert/delete penalties.

Smith-Waterman: Local Sequence Alignment.

Smith-Waterman, in contrast to Needleman-Wunsch, performs a local sequence alignment. Given two input strings, Smith-Waterman finds the substrings of the input that have the best alignment, where longer substrings have a better alignment. The recurrence equation is as follows:

$$s_{i,j} = \max \begin{cases} 0 \\ s_{i-1,j-1} + m[i, j] \\ s_{i-1,j} - d \\ s_{i,j-1} - d \end{cases} \quad \text{equ. (17)}$$

One difference between equation (17) and equation (16) from Needleman-Wunsch is the zero (e.g., "0") term in "max" which ensures that alignments "restart" whenever the score goes to zero. Because of this zero term, the constants in $A_i$ matrices in equation (1) may be set accordingly. This change may alter the convergence properties of Smith-Waterman.

In various embodiments, the solution to Smith-Waterman is based on finding the maximum of all sub-problems in all stages and performing a predecessor traversal from that sub-problem. To account for this in the LTDP formulation, a "running maximum" sub-problem may be added per stage that contains the maximum of all sub-problems in the current stage and previous stages.

Accordingly, the techniques and/or systems described herein, based on the supporting mathematics described above, speed-up the execution of a variety of dynamic programming problems on devices at least because a device can parallel process a dynamic programming problem across multiple stages and/or clusters.

CONCLUSION

Although the present disclosure may use language that is specific to structural features and/or methodological acts, the invention is not limited to the specific features or acts described herein. Rather, the specific features and acts are disclosed as illustrative forms of implementing the invention.

What is claimed is:

1. A system comprising:
   one or more hardware processing units;
   memory storing instructions that, when executed by the one or more hardware processing units, cause the system to perform operations comprising:
   determining at least a first stage that includes one or more sub-problems of a dynamic programming problem;
   determining a second stage includes one or more sub-problems of the dynamic programming problem, wherein solutions to the one or more sub-problems in the second stage depend on at least one solution produced by at least one sub-problem of the one or more sub-problems included in the first stage;
   determining a first group of stages that includes the first stage;
   determining a second group of stages that includes the second stage;

generating a solution to be used instead of the at least one solution on which the one or more sub-problems of the second stage depend; and processing the first group of stages and the second group of stages in parallel via a first hardware processing unit and a second hardware processing unit, respectively, wherein the processing of the second group of stages uses the generated solution to compute solutions to the one or more sub-problems in the second stage, one or more of the computed solutions being parallel to a true solution.

2. The system of claim 1, wherein the true solution comprises an actual solution that would have been computed using the at least one solution on which the one or more sub-problems of the second stage depend.

3. The system of claim 1, wherein processing the second group of stages comprises identifying a stage within the second group of stages where a rank converges to one thereby indicating that subsequent solutions computed using the generated solution are parallel to true solutions.

4. The system of claim 1, wherein the generated solution is used to compute the solutions to the one or more sub-problems of the second stage prior to or during computation of solutions to the one or more sub-problems of the first stage.

5. The system of claim 1, further comprising:
actually computing, during or after the processing the first group of stages and the second group of stages in parallel, the at least one solution on which the one or more sub-problems of the second stage depend; and
re-computing, as part of a fix-up phase, at least one solution to the one or more sub-problems of the second stage based at least in part on the at least one solution actually computed.

6. The system of claim 1, wherein the processing comprises:
sequentially executing stages in the first group of stages; and
sequentially executing stages in the second group of stages.

7. The system of claim 1, further comprising breaking a dependency between the first stage and the second stage.

8. The system of claim 1, wherein individual solutions comprise one or more values used to populate a table.

9. The system of claim 1, wherein the generated solution comprises one or more randomly generated values.

10. The system of claim 1, wherein the dynamic programming problem comprises at least one of a Viterbi problem, a Needleman-Wunsch problem, a Smith-Waterman problem, and/or a Longest Common Subsequence problem.

11. One or more computer-readable storage media comprising instructions that, when executed by one or more processors, configure a device to perform operations comprising:
dividing a plurality of stages of a dynamic programming problem into at least a first group of stages and a second group of stages, each stage comprising one or more sub-problems individually configured to compute a solution independent of solutions computed by other sub-problems in a same stage;
generating a solution to break a dependency between a last stage of the first group of stages and a first stage of the second group of stages; and
processing the first group of stages and the second group of stages in parallel via at least a first processing unit and a second processing unit, respectively, wherein the second processing unit implements sequential processing of the stages in the second group of stages using the generated solution.

12. The one or more computer-readable storage media of claim 11, wherein the processing of the second group of stages using the generated solution comprises determining one or more solutions that are parallel to actual solutions that would have been computed had the dependency not been broken.

13. The one or more computer-readable storage media of claim 11, wherein processing the second group of stages comprises identifying a stage within the second group of stages where a rank converges to one thereby indicating that solutions computed using the generated solution are parallel to actual solutions.

14. The one or more computer-readable storage media of claim 11, wherein the generated solution comprises one or more randomly generated values.

15. The one or more computer-readable storage media of claim 11, wherein the dynamic programming problem comprises at least one of a Viterbi problem, a Needleman-Wunsch problem, a Smith-Waterman problem, and/or a Longest Common Subsequence problem.

16. A method comprising:
dividing sub-problems of a dynamic programming problem into multiple stages, wherein an individual stage of the multiple stages includes one or more sub-problems individually configured to compute a solution independent of solutions to other sub-problems of the one or more sub-problems in the individual stage;
dividing the multiple stages into at least a first group and a second group separated by at least one dependent solution;
generating one or more solutions; and
processing the first group and the second group in parallel via a first hardware processing unit and a second hardware processing unit, respectively, wherein processing the second group includes computing one or more solutions using the one or more generated solutions instead of the at least one dependent solution.

17. The method of claim 16, wherein the processing of the second group comprises determining one or more solutions that are parallel to actual solutions that would have been computed based on use of on the at least one dependent solution.

18. The method of claim 16, wherein processing the second group comprises identifying a stage within the second group where a rank converges to one thereby indicating that solutions computed using the one or more generated solutions are parallel to actual solutions that would have been computed based on use of on the at least one dependent solution.

19. The method of claim 16, wherein the one or more generated solutions comprise one or more arbitrary solutions.

20. The method of claim 16, wherein the dynamic programming problem comprises at least one of a Viterbi problem, a Needleman-Wunsch problem, a Smith-Waterman problem, and/or a Longest Common Subsequence problem.

* * * * *